(12) United States Patent
Won et al.

(10) Patent No.: US 6,355,108 B1
(45) Date of Patent: Mar. 12, 2002

(54) FILM DEPOSITION USING A FINGER TYPE SHADOW FRAME

(75) Inventors: Tae Kyung Won, Santa Clara; Quanyuan Shang; Robert M. Robertson, both of Saratoga, all of CA (US); Soo Young Choi, Mun San Up (KR); Kam S. Law, Union City, CA (US); Robert I. Greene, Fremont, CA (US); John M. White, Santa Clara, CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/338,245

(22) Filed: Jun. 22, 1999

(51) Int. Cl.$^7$ ............................................. C23C 16/00
(52) U.S. Cl. .................... 118/728; 118/723 R; 118/500
(58) Field of Search ....................... 165/80.2; 361/234; 438/164, 778; 204/298.15; 269/289 R; 414/754; 156/345; 118/728, 500

(56) References Cited

U.S. PATENT DOCUMENTS

| | | | |
|---|---|---|---|
| 4,978,412 A | * 12/1990 | Aoki et al. .................. 156/345 |
| 5,326,725 A | * 7/1994 | Sherstinsky et al. ........ 438/778 |
| 5,421,401 A | * 6/1995 | Sherstinsky et al. ....... 165/80.2 |
| 5,447,570 A | 9/1995 | Schmitz et al. ............. 118/728 |
| 5,476,810 A | * 12/1995 | Curran ........................ 438/164 |
| 5,611,865 A | 3/1997 | White et al. ................ 118/725 |
| 5,632,873 A | * 5/1997 | Stevens et al. ........ 204/298.15 |
| 5,740,009 A | * 4/1998 | Pu et al. ...................... 361/234 |
| 5,753,133 A | 5/1998 | Wong et al. ................... 216/67 |
| 5,860,640 A | * 1/1999 | Marohl et al. .......... 269/289 R |
| 6,126,382 A | * 10/2000 | Scales et al. ................ 414/754 |

OTHER PUBLICATIONS

S. Ponnekanti, et al, "Failure mechanisms of anodized aluminum parts used in CVD chambers", J. Vac.Sci. Tech. A14(3), pp. 1127–1131, Jun. 1996.*

U.S. patent application Ser. No. 09/026,575; filed Feb. 20, 1998, Inagawa et al.; Entitled: *Shadow Frame For Substrate Processing.*

* cited by examiner

Primary Examiner—Gregory Mills
Assistant Examiner—Rudy Zervigon
(74) Attorney, Agent, or Firm—Moser, Patterson & Sheridan, LLP

(57) ABSTRACT

The present invention relates generally to a clamping and alignment assembly for a substrate processing system. The clamping and aligning assembly generally includes a shadow frame, a floating plasma shield and a plurality of insulating alignment pins. The shadow frame comprises a plurality of tabs extending inwardly therefrom and is shaped to accommodate a substrate. The tabs comprise protruding contact surfaces for stabilizing a substrate on a support member during processing. The insulating alignment pins are disposed at a perimeter of a movable support member and cooperate with an alignment recess formed in the shadow frame to urge the shadow frame into a desired position. Preferably, the floating plasma shield is disposed on the insulating alignment pins in spaced relationship between the support member and the shadow frame to shield the perimeter of the support member during processing.

27 Claims, 8 Drawing Sheets

FILM DEPOSITION USING A FINGER TYPE SHADOW FRAME

BACKGROUND OF THE INVENTION

1. Field of the Invention

The present invention relates to a method and apparatus for use in processing a substrate. More particularly, the invention relates to a shadow frame for aligning and stabilizing a substrate during processing.

2. Background of the Related Art

In the fabrication of flat panel displays, transistors, liquid crystal cells, metal interconnects and other features are formed by depositing and removing multiple layers of conducting, semiconducting and dielectric materials from a glass substrate. Glass substrate processing techniques include plasma-enhanced chemical vapor deposition (PECVD), physical vapor deposition (PVD), etching and the like. Plasma processing is particularly well-suited for the production of flat panel displays because of the relatively lower processing temperatures required to deposit a film and good film quality which should result from using plasma processes.

In general, plasma processing involves positioning a substrate on a support member (often referred to as a susceptor or heater) disposed in a vacuum chamber and striking a plasma adjacent to the upper exposed surface of the substrate. The plasma is formed by introducing one or more process gases into the chamber and exciting the gases with an electrical field to cause dissociation of the gases into charged and neutral particles. A plasma may be produced inductively, e.g., using an inductive RF coil, and/or capacitively, e.g., using parallel plate electrodes, or by using microwave energy.

During processing, the edge and backside of the glass substrate as well as the internal chamber components must be protected from deposition. Typically, a deposition-masking device, or shadow frame, is placed about the periphery of the substrate to prevent processing gases or plasma from reaching the edge and backside of the substrate and to hold the substrate on a support member during processing. The shadow frame may be positioned in the processing chamber above the support member so that when the support member is moved into a raised processing position the shadow frame is picked up and contacts an edge portion of the substrate. As a result, the shadow frame covers several millimeters of the periphery of the upper surface of the substrate, thereby preventing edge and backside deposition on the substrate.

However, while conventional shadow frames may reduce edge and backside deposition on a substrate, the usable area of the substrate is greatly reduced. Typically, shadow frames comprise a lip portion extending over the edge of the substrate. The lip prevents any portion of the masked area of the substrate from receiving deposition, an effect known as edge exclusion. Consequently, each processed substrate includes an unprocessed, unusable portion which reduces the usable surface area on a substrate and results in lower productivity of the processing system.

One attempt to reduce the edge exclusion is the use of finger-type shadow frames. Finger-type shadow frames comprise a plurality of "fingers" or tabs extending outwardly from the shadow frame to stabilize a substrate during processing. The fingers are disposed around the edge of a substrate, thereby increasing the amount of usable substrate surface area as compared to the lip-type shadow frame which comprehensively covers the edge of the substrate.

However, finger-type shadow frames exhibit poor control of the plasma during processing. Successful plasma processing requires a uniform plasma density across the entire upper surface of a substrate during processing. Anomalies in the plasma density result in non-uniform deposition of films on the substrate leading to defective devices and thus further reducing the throughput of the processing system. In the case of flat panel display manufacturing, maintaining a uniform plasma at the perimeter of the substrate is particularly difficult due to various components of the vacuum system which can act as energy sinks. In conventional systems using finger-type shadow frames, for example, the shadow frame and the outermost edge of the substrate define a gap provided to prevent arcing which can occur between the shadow frame and the substrate resulting in damage to the substrate. However, the gap exposes the perimeter of the support member to the plasma and provides a ground to drain the plasma constituents. Thus, the plasma density at a perimeter of the substrate is often substantially less than the plasma density over the central portion of the substrate. Because the deposition thickness is related to the plasma uniformity, non-uniform deposition results.

FIGS. 1 and 2 illustrate the non-uniform deposition resulting from anomalies in the plasma density using a finger-type shadow frame. FIGS. 1 and 2 represent processes performed in a conventional processing chamber wherein the plasma experienced drainage at a perimeter portion of the substrate. Referring to FIG. 1, for example, the deposition rate between about 0 mm and 30 mm and between about 690 mm and 720 mm is shown tapering off rapidly indicating the loss of uniformity. Thus, the edge of the substrate constitutes unusable area, thereby decreasing the margin of the process and the productivity of the processing system.

Another problem with flat panel display processing is the detrimental effects of thermal dynamics. During processing, the support member is heated by means of a heating element, such as a resistive coil, or by other methods in order to heat the substrate disposed thereon. Uniform heat conduction between the support member and the substrate are necessary to ensure uniform deposition. Where the thermal profile across the substrate is not uniform, i.e., where the profile exhibits relative hot and cold spots, the deposition of material onto the substrate is non-uniform and results in defective devices. Flat panel displays are particularly susceptible to the detrimental effects of thermal non-uniformity because of the area of the substrates exposed to deposition material as compared to their thicknesses, and because of the differences in the thermal conductivity of the substrates, typically comprising glass, and the support member, typically comprising a metal. In a typical process, the substrate may be about 30–60° C. less than the temperature of the support member which may be heated to a temperature between about 250–470° C. The support member will typically be more conductive than the glass but also be locally heated to a greater temperature adjacent to the heating element. This leads to localized heating of the glass which, because of its low expansion coefficient and lower thermal coefficient, will expand at the localized hot spots resulting in warping or bowing. Warping is also induced where a cooling gas is supplied to the backside of the substrate. The cooling gas can provide a backside pressure causing the substrate to bow or warp. To ensure good heat conduction and minimize warping, the substrate and the support member must be maintained in close and uniform contact, thus warping and bowing should be avoided.

Current efforts to achieve good thermal conduction between the substrate and the support member include providing a clamping force at the perimeter of the substrate by use of a shadow frame as described above, which keeps the glass edges flat and helps trap the cooling gas in the space between the substrate and the support member. However, as noted previously, conventional shadow frames typically cover a substantial portion of the substrate edge resulting in reduced usable area on the substrate. Further, the clamping force is often excessive causing damage to the substrate. For example, U.S. Pat. No. 5,753,133 provides an apparatus using a spring-biased clamping mechanism to position a substrate in a vertical position during processing. The pressure supplied by such an arrangement can cause the substrate to fracture or warp during the elevated processing temperatures.

Yet another problem with flat panel display processing is the improper positioning of the substrate on the support member and relative positioning with the shadow frame. For uniform deposition, alignment of the substrate relative to the support member as well as the shadow frame is required. While the alignment of the substrate to the support member is typically accomplished by calibration of the substrate transfer robot, which is used to position the substrate on, and remove the substrate from, the support member, the proper alignment of the shadow frame is not provided for in conventional designs. If the shadow frame is not properly centered with respect to the substrate during processing, the amount of shadowing that occurs on each edge of the substrate will be unequal. Misalignment of the shadow frame can lead to decreases in productivity and heightened operating costs.

Therefore, there is a need for a clamping and aligning assembly that minimizes edge exclusion while providing sufficient clamping force to stabilize a substrate during processing. Further, there is a need for an assembly that inhibits the drainage of plasma to chamber components.

SUMMARY OF THE INVENTION

The present invention generally provides a clamping and aligning assembly for use in a vacuum chamber. In one embodiment a shadow frame is provided having a plurality of tabs are disposed on the shadow frame and extend inwardly therefrom. The tabs comprise protruding contact surfaces for stabilizing a substrate during processing.

In another embodiment, a substrate clamping and aligning assembly is provided having a shadow frame and a floating plasma shield supported by a plurality of insulating members. A plurality of tabs are disposed on the shadow frame and extend inwardly therefrom. The tabs comprise protruding contact surfaces for stabilizing a substrate during processing. The floating plasma shield is disposed on the insulating members at a perimeter portion of a movable support member.

In yet another embodiment, a substrate clamping and aligning assembly is provided having a shadow frame, a floating plasma shield and a plurality of insulating alignment pins. A plurality of tabs are disposed on the shadow frame and extend inwardly therefrom. The tabs comprise protruding contact surfaces for stabilizing a substrate during processing. The insulating alignment pins are disposed at a perimeter of a movable support member. A tapered surface of the insulating alignment pins cooperates with a corresponding, conforming surface of an alignment recess formed in the shadow frame to urge the shadow frame into a desired position. Preferably, the floating plasma shield is disposed on the insulating alignment pins in spaced relationship to the support member and below the shadow frame to shield the perimeter of the support member during processing.

In still another embodiment, a substrate processing chamber is provided having a clamping and aligning assembly disposed therein. The processing chamber defines a processing region and includes a support member selectively movable into the processing region. The clamping and aligning assembly includes a shadow frame, a floating plasma shield and a plurality of insulating alignment pins. The shadow frame is disposed in the processing chamber adjacent to the processing region and is shaped to accommodate a substrate. A plurality of tabs are disposed on the shadow frame and extend inwardly therefrom. The tabs comprise protruding contact surfaces for stabilizing a substrate during processing under the weight of the shadow frame. The insulating alignment pins are disposed at a perimeter of the support member and include an upper tapered surface that cooperates with a corresponding, conforming surface of an alignment recess formed in the shadow frame to urge the shadow frame into a desired position during the upward motion of the insulating alignment pins. Preferably, the floating plasma shield is disposed on the insulating alignment pins in spaced relationship to the support member and below the shadow frame to shield the perimeter of the support member during processing.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 3:
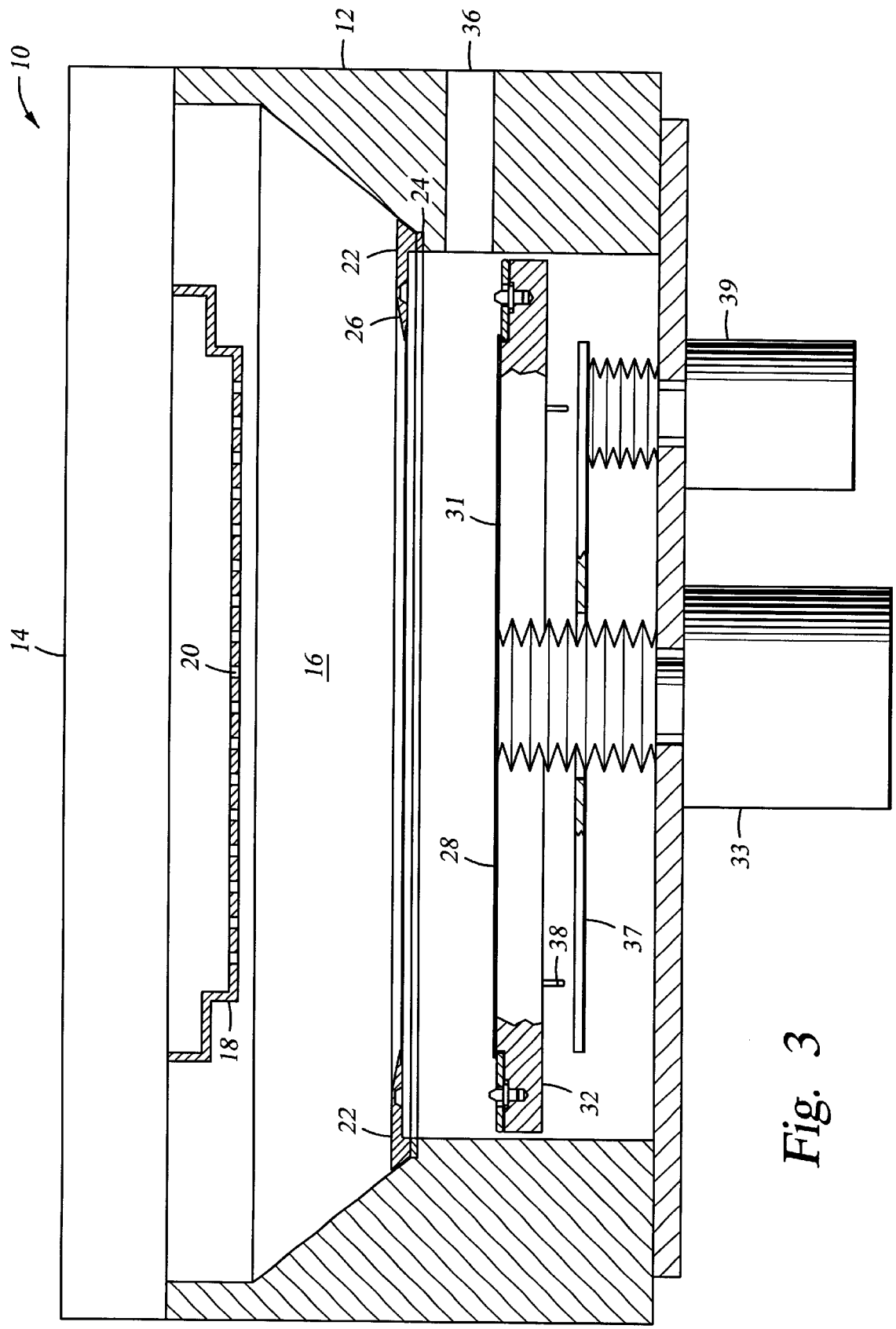
FIG. 3 is a cross sectional view of a processing chamber.

FIG. 3 is a cross section of an exemplary processing chamber 10 of the present invention adapted for processing flat panel displays. The processing chamber 10 comprises a body 12 and a lid 14 disposed on the body 12. The processing chamber 10 defines a cavity which includes a processing region 16. A gas dispersion plate 18 is mounted to the lid 14 and defines the upper boundary of the processing region 16. A plurality of holes 20 are formed in the gas dispersion plate 18 to allow delivery of processing gases therethrough. A shadow frame 22 is shown disposed on a ledge 24 of the body 12. The shadow frame 22 includes a plurality of tabs 26 extending inwardly into the processing region 16 and positioned to contact a substrate in a processing position.

Figure 4:
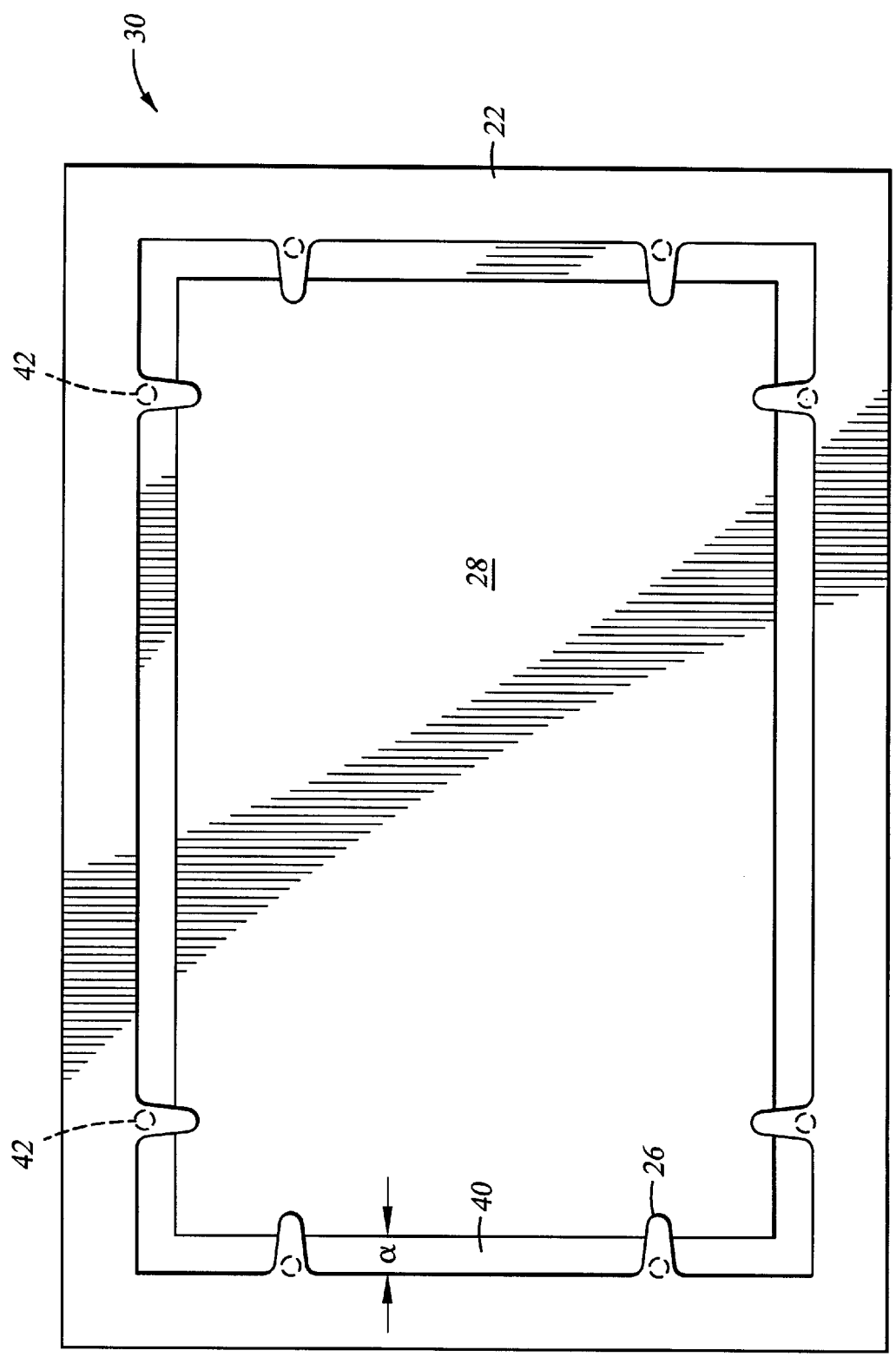
FIG. 4 is a top view of a shadow frame stabilizing a substrate.

FIG. 4 is a top view of the shadow frame 22 shown disposed on a substrate 28. The shadow frame 22 is substantially rectangular and defines the usable area of the substrate 28. The shadow frame 22 is part of a clamping and aligning assembly 30 described in detail with reference to FIGS. 5–8.

Referring again to FIG. 3, a movable support member 32, also referred to as a susceptor or heater, is disposed in the processing chamber 10 and is actuated by a motor 33. In a raised processing position, the support member 32, having the substrate 28 disposed on an upper surface 31 thereof, lifts the shadow frame 22 from the ledge 24 and defines the lower boundary of the processing region 16 such that the substrate 28 is positioned in the processing region 16. In a lowered position, the support member 32 can receive a substrate from a robot blade. The substrate is introduced into the chamber 10 through an opening 36 formed in the body 12 which is selectively sealed by a slit valve mechanism (not shown). Lift pins 38 (preferably four) are slidably disposed through the support member 32 and are adapted to hold a substrate at an upper end thereof. The lift pins 38 are actuatable by an elevator plate 37 and a motor 39 coupled thereto. The operation of the processing chamber 10 will be discussed in greater detail below.

Figure 5:
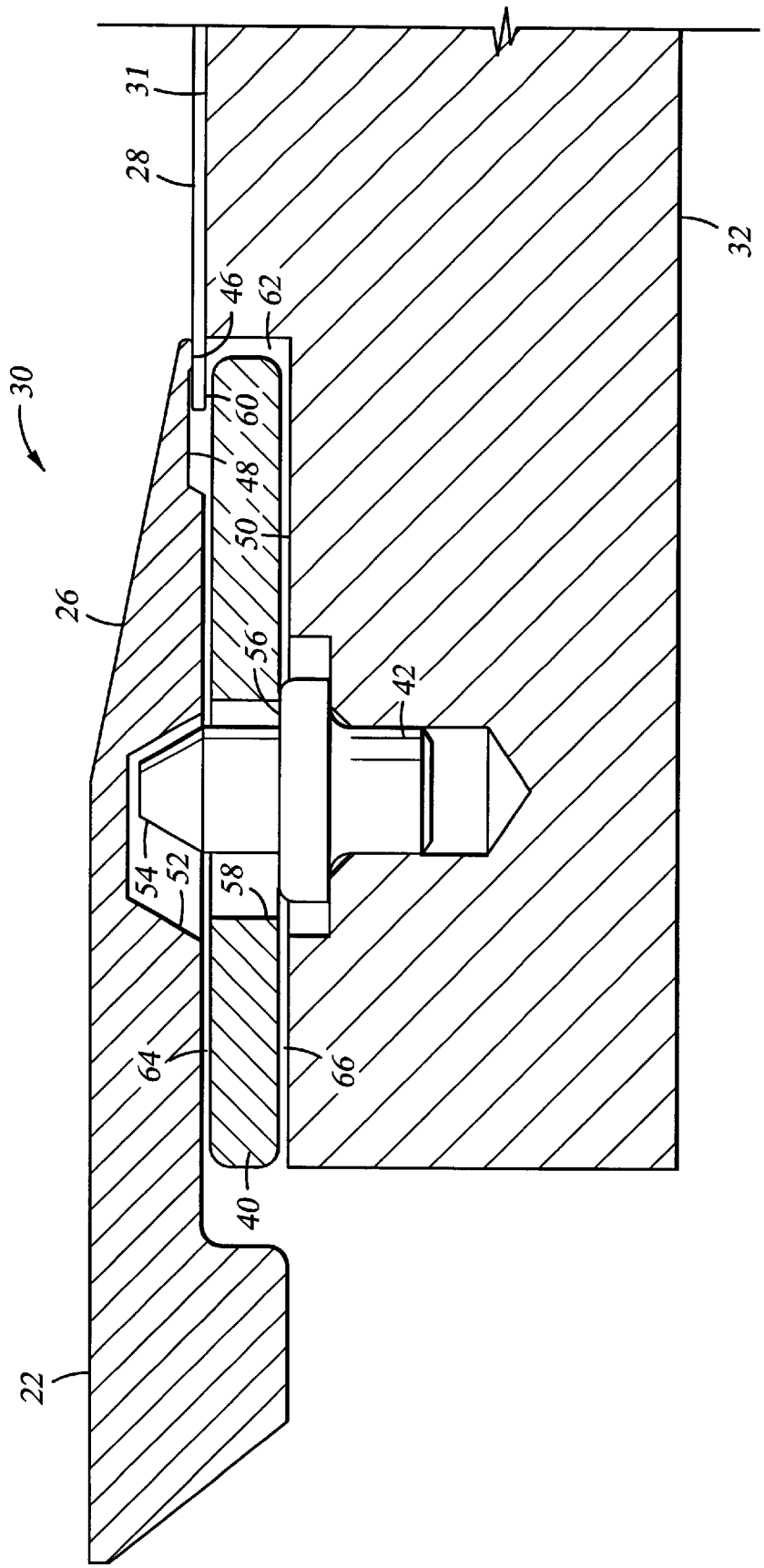
FIG. 5 is a partial cross sectional view of a clamping and aligning assembly including the shadow frame of FIG. 4.

FIG. 5 is a partial cross section of the clamping and aligning assembly 30 shown in a processing position. In general, the clamping and aligning assembly 30 comprises the shadow frame 22, a floating plasma shield 40, and a plurality of alignment pins 42 supported on the support member. Although preferably separate components, the shadow frame 22, floating plasma shield 40, and a plurality of alignment pins 42 cooperate during processing in the manner described below.

The shadow frame 22 is preferably a unitary body shaped to accommodate a substrate (rectangular in the case of flat panel glass substrates as shown in FIG. 4) and is preferably constructed of a metal, such as aluminum, anodized aluminum and ceramic. The shadow frame 22 comprises a plurality of tabs 26 extending over an edge portion 60 of the substrate 28. A tip of the tabs 26 provides a protruding contact surface 46. The contact surface 46 defines the portion of the shadow frame 22 that maintains contact with the substrate 28 during processing. Preferably, the contact surface 46 is minimized so that the potential for damage to the substrate 28 caused by the contact of the shadow frame 22 and the substrate is minimized. In a preferred embodiment, the contact surface 46 is between about 5 mm$^2$ and 15 mm$^2$. Preferably, the contact surface 46 includes rounded surfaces such as are shown in FIG. 5. The rounded surfaces are adapted to reduce possible damage to the substrate 28 due to mechanical and thermal stresses during processing. Prior art shadow frames typically comprise clamping mechanisms having sharp corners. Such sharp corners can scratch or fracture substrates when brought into contact therewith such as during the loading and unloading of the substrate from the process chamber. Further, during processing, the substrate and the shadow ring experience expansion and contraction causing mechanical stress therebetween and often resulting in damage to the substrate.

A roof portion 48 of the tabs 26 forms a recess outwardly of the contact surface 46. The roof portion 48 is in spaced relation from the substrate 28 so that contact at the outermost edge of the substrate 28 is avoided. Contact with the substrate 28 is preferably maintained only at the contact surface 46. Thus, the contact surface 46 and the roof portion 48 cooperate to minimize contact with the substrate 28. Further, the roof portion 48 is spaced from the substrate to accommodate any thermal expansion of the shadow frame and/or the substrate. Alignment of the shadow frame 22 is facilitated by the cooperation of an alignment recess 52 formed in the shadow frame 22 and an upper tapered surface 54 of the plurality of alignment pins 42. The alignment pins are preferably constructed of an insulator such as ceramic. As shown in FIG. 5, the alignment pins 42 are positioned in a recessed shoulder 50 formed in the perimeter of the support member 32 and are partially disposed through the floating plasma shield 42. At an upper end, the alignment pins 42 form a tapered surface 54. The tapered surface 54 cooperates with the alignment recess 52 to urge the shadow frame 22 into a desired location relative to the support member 32, as described in greater detail below. An annular support surface 56 is provided at a mid-section of the alignment pins 42 and is adapted to support the floating plasma shield 40 with a gap between the plasma shield 40 and the support member 32.

The floating plasma shield 40 is disposed in the recessed shoulder 50 between the shadow frame 22 and the support member 32 when the shadow frame 22 is received for processing. The recessed shoulder 50 is adapted to position the floating plasma shield 40 so that an overhanging edge 60 of the substrate 28 extends over a portion of the shield 40. The floating plasma shield 40 is preferably shaped substantially the same in perimeter as the shadow frame 22, i.e., rectangular for use with a rectangular substrate, and is supported by the annular support surface 56 of the alignment pins 42. Holes 58 formed in the floating plasma shield 40 allow the upper ends of the alignment pins 42 to extend therethrough. In a processing position, the floating plasma shield 40 is disposed in a gap α formed between the substrate 28 and the shadow frame 22, as shown in FIG. 4. The term "floating" is used to describe the electrical disposition of the floating plasma shield 40. Thus, as shown in FIG. 5, the floating plasma shield 40 is disposed on an insulating member, the alignment pin 42, and maintains a spaced relationship with the support member 32.

As shown in FIG. 5 gaps 62, 64, 66 are provided between various features of the clamping and aligning assembly 30. The gaps 62, 64, 66 accommodate the thermal expansion and contraction of the clamping and aligning assembly 30 during processing. Thus, the size of the gaps 62, 64, 66 is, in part, determined by the material used to construct the floating shield 40 which is preferably aluminum or ceramic. Where the floating plasma shield 40 comprises a conducting material, such as aluminum, the gaps 62 and 66 prevent contact with, and thus electrical conduction between, the support member 32 and the floating shield 40. Gaps 62, 64, 66 additionally prevent rubbing contact which would create particles, or compressive loading between parts leading to cracks and chips. However, the dimensions provided herein are merely illustrative and may be changed according to a particular application.

Figure 6:
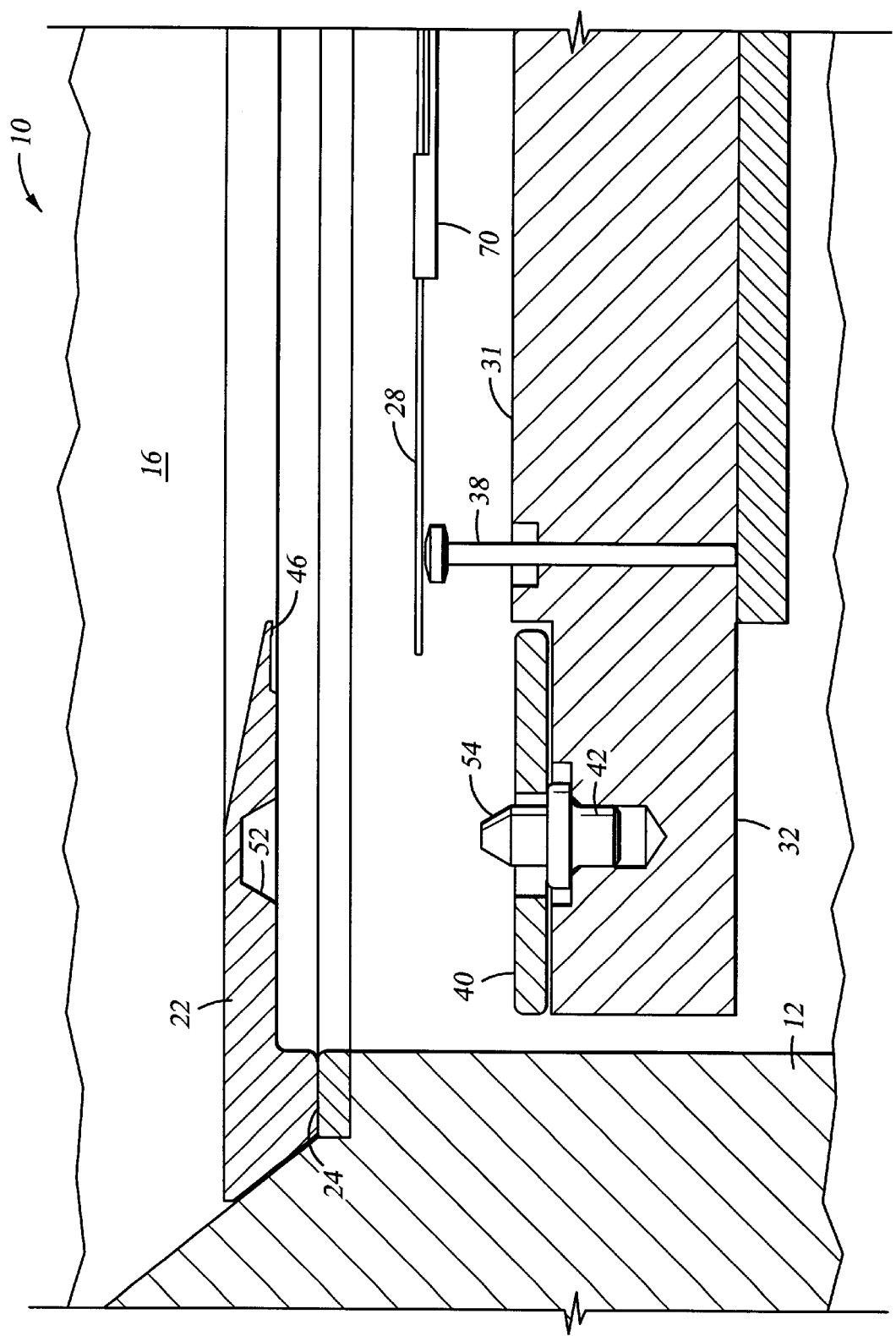
FIG. 6 is a partial cross sectional view of a clamping and aligning assembly in a substrate receiving position.
Figure 7:
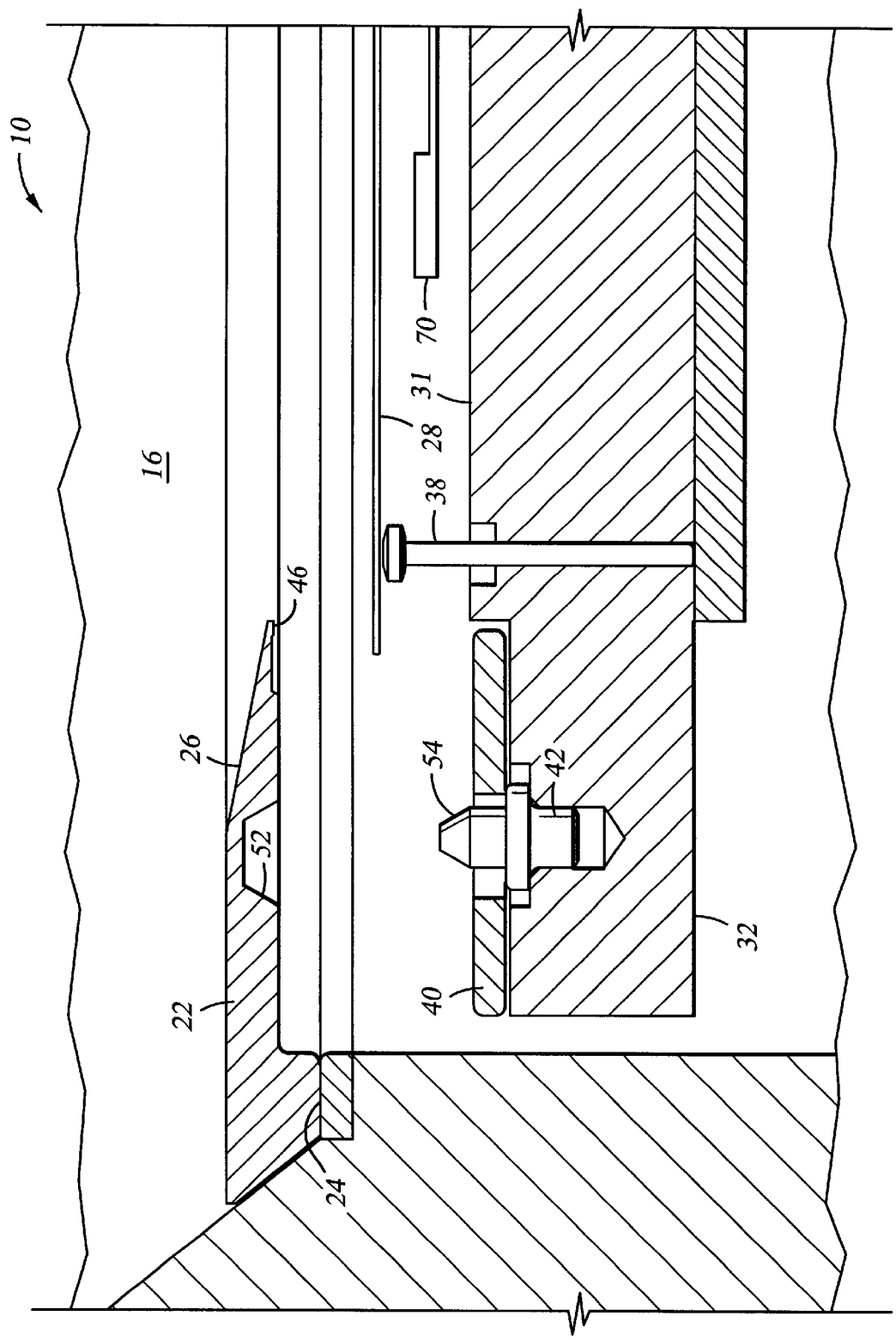
FIG. 7 is a partial cross sectional view of a clamping and aligning assembly in a substrate transferring position.
Figure 8:
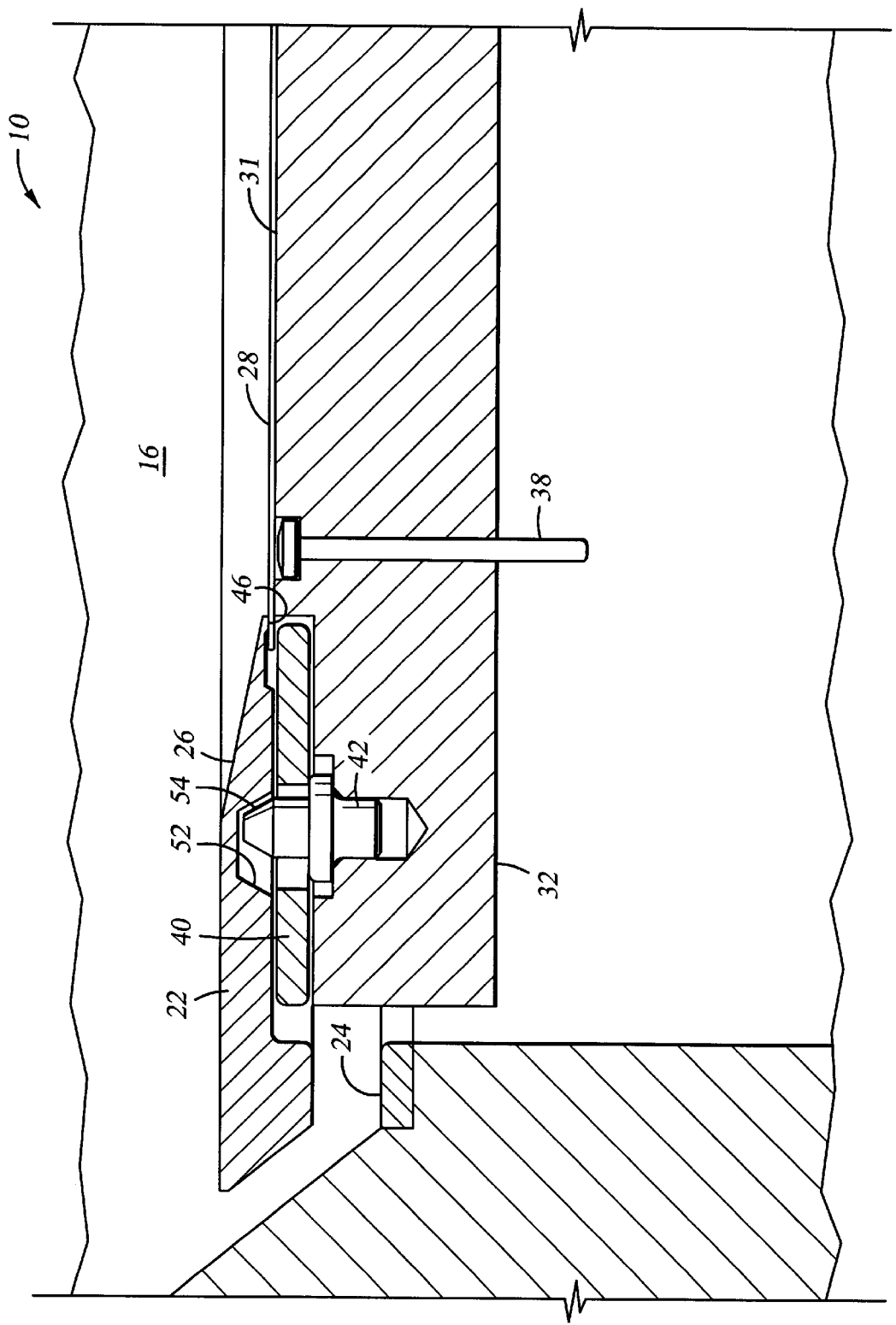
FIG. 8 is a partial cross sectional view of a clamping and aligning assembly in a substrate processing position.

The operation of the clamping and aligning assembly 30 is more fully understood with reference to FIGS. 6–8. Initially, a substrate 28 is introduced into the processing chamber 10 through an opening 36 (shown in FIG. 3) using a conventional robot blade 70, as shown in FIG. 6. The substrate 28 is supported on an upper surface of the robot blade 70 and is positioned above the raised lift pins 38. The support member 32 and lift pins 38 are then actuated by motors 33 and 39 (shown in FIG. 3), respectively, to bring the lift pins 38 into contact with the substrate 28, thereby lifting the substrate 28 from the robot blade 70 as shown in FIGS. 6 and 7. The robot blade 70 is then retracted and the support member 32 is raised relative to the stationary lift pins 38. Upon the continuing motion of the support member 32, the upper ends of the alignment pins 42 are received by the alignment recess 52 of the shadow frame 22, as shown in FIG. 8. Any lateral offset of the shadow frame 22 relative to the support member 32 is adjusted by cooperation of the tapered surface 54 of the alignment pins 42 and the corresponding, conforming surface of the alignment recess 52. Thus, the shadow frame 22 is urged into a desired position before any contact between the shadow frame 22 and the substrate 28 occurs. Subsequently, the substrate 28 is brought into contact with the tabs 26 of the shadow frame 22, thereby lifting the shadow frame 22 from the ledge 24, as shown in FIG. 8. In a processing position, shown in FIG. 8, the shadow frame 22 is disposed on the substrate 28 positioned in the processing region 16. The tabs 26 extend over an edge of the substrate 28 and contact an upper surface thereof. Thus, only a small portion of the substrate 28 is obscured by the shadow frame 22 during processing.

In a processing position, shown in FIGS. 5 and 8, the shadow frame 22 is supported by the substrate 28 and maintains a spaced relation with the floating plasma shield 40 to define gap 64. Thus, the shadow frame 22 provides a clamping pressure on the perimeter substrate 28 during processing while maintaining an electrically insulated position relative to other chamber components. The pressure supplied by the weight of the shadow frame 22 is localized to the areas of contact between the tabs 26 and the substrate 28. In order to prevent damage to the substrate 28, the pressure can be optimized by altering the weight of the shadow frame 22, the number of tabs 26 and/or the contact area provided by each tab 26. However, while additional tabs 26 may be used to reduce the pressure applied at each contact point, the number of tabs 26 is preferably minimized in order to maximize the usable space of the substrate 28. In a specific embodiment, shown in FIG. 4, eight (8) tabs 26 are provided for a substrate between about 300 mm$^2$×400 mm$^2$ to about 1000 mm$^2$×1000 mm$^2$. For a shadow frame 22 weighing between about 3 lbs to about 7.1 lbs and having 8 tabs each with a contact area between about 4 mm$^2$ and about 8 mm$^2$, the effective local pressure on the substrate is about 0.05 lbs/mm$^2$ and about 0.2 lbs/mm$^2$. Further, in order to reduce the potential for bowing or warping of the substrate 28, the pressure is preferably supplied directly over the outer edge of the upper surface 31 of the substrate 28 or slightly outwardly thereof, i.e., on the overhanging edge 60 of the substrate 28 as shown in FIG. 5. Bowing or warping typically occurs at the outer portion of a substrate resulting in a convex shape of the substrate relative to the support member 32. Thus, applying the pressure proximate the outer edge of the upper surface 31 prevents an upward bowing effect of the substrate edge.

The deposition process is initiated by introducing one or more process gases into the chamber 10 via the gas distribution plate 18 (shown in FIG. 3) and exciting the gases into a plasma state by supplying an electric field to the processing region 16, thereby forming radicals of a deposition gas which will form a thin film on the substrate. The plasma is preferably maintained over the entire upper surface of the substrate 28 to ensure uniform deposition and a maximum usable surface area on the substrate. As shown in FIG. 4, a gap a is defined between the shadow frame 22 and the substrate 28. In conventional apparatus, such a gap resulted in unwanted deposition on the support member 32 (shown in FIG. 3) and other chamber components and also provided a pathway for plasma to ground to the chamber components, thereby diminishing the plasma density at the edge of the substrate 28. The present invention overcomes the disadvantages of prior art by positioning the floating plasma shield 40 in the gap a. Further, a portion of the floating plasma shield 40 is disposed below the overhanging edge 60 (shown in FIG. 5) of the substrate 28. Thus, the floating plasma shield 40 and the substrate 28 cooperate to effectively seal the gap a and substantially eliminate the potential for plasma drainage to the support member 32 (shown in FIG. 3). The potential for plasma drainage is further mitigated by positioning the shadow frame 22 in a spaced relation relative to the support member 32. Such an arrangement electrically isolates the shadow frame 22 during processing when an insulative material, such as glass, is disposed between the shadow frame 22 and the support member 32. Thus, the invention reduces the grounding effect of the floating shield and the shadow frame 22 and prevents the charged constituents of the plasma, such as electrons, from draining out of the plasma, thereby maintaining a constant and uniform plasma. Further, the floating shield 40 prevents deposition from reaching the support member 32, thereby reducing the periodic cleaning of the support member 32 which is necessary with conventional assemblies. When necessary, the floating shield 40 may be removed and replaced with a clean floating shield without impacting the throughput of the processing system. The removed floating shield 40 can then be clean and recycled for later use.

EXAMPLES

Figure 1:
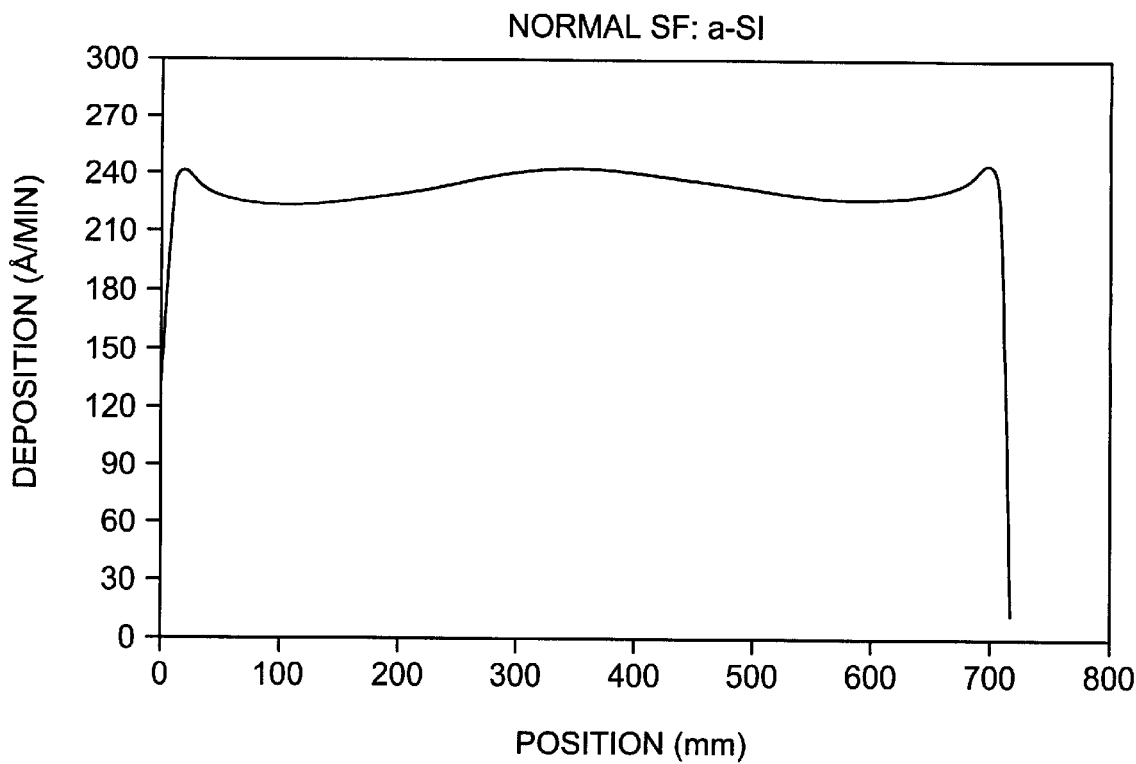
FIG. 1 is a graphical representation of the planarity of a flat glass panel substrate having a layer of amorphous silicon deposited thereon using a conventional shadow frame.
Figure 2:
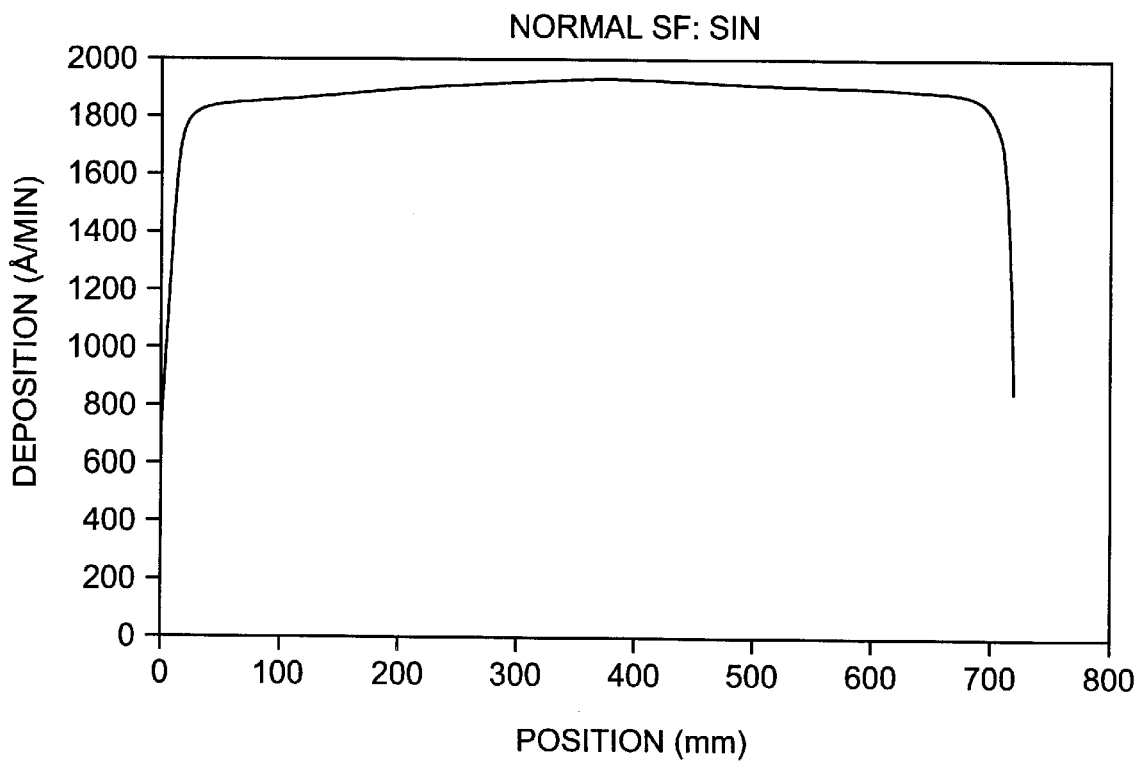
FIG. 2 is a graphical representation of the planarity of a flat glass panel substrate having a layer of silicon nitride deposited thereon using a conventional shadow frame.
Figure 9:
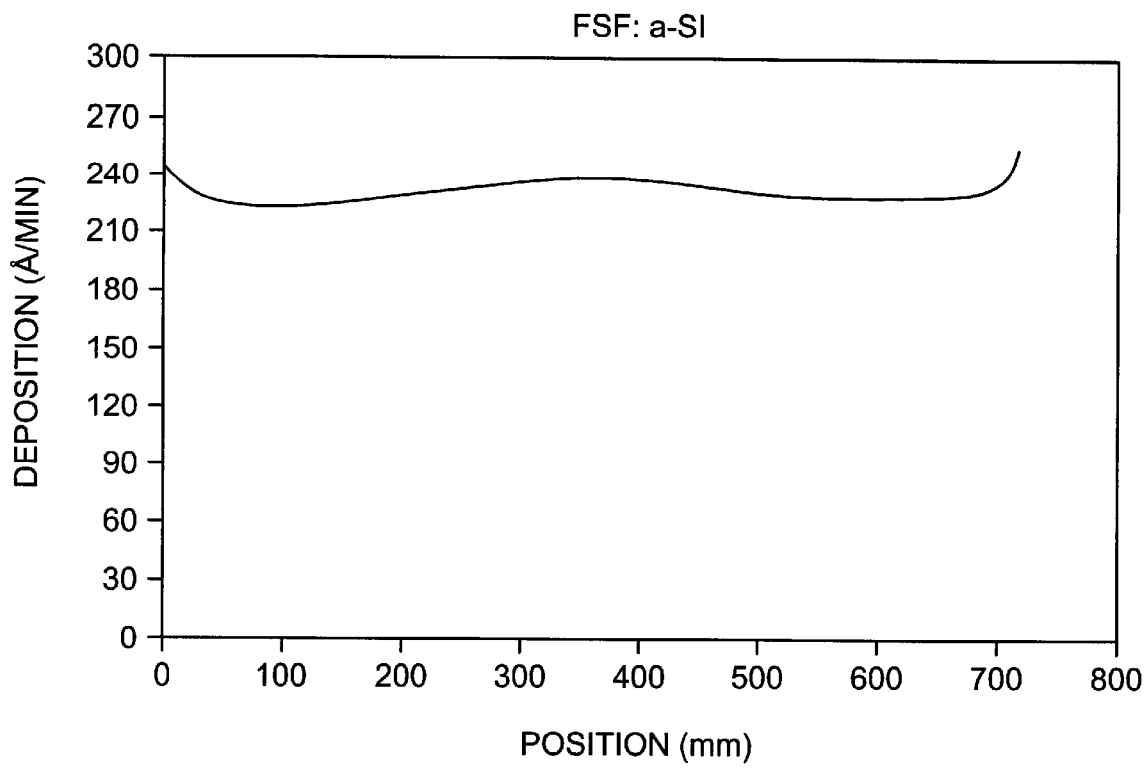
FIG. 9 is a graphical representation of the planarity of a flat glass panel substrate having a layer of amorphous silicon deposited thereon using the present invention.
Figure 10:
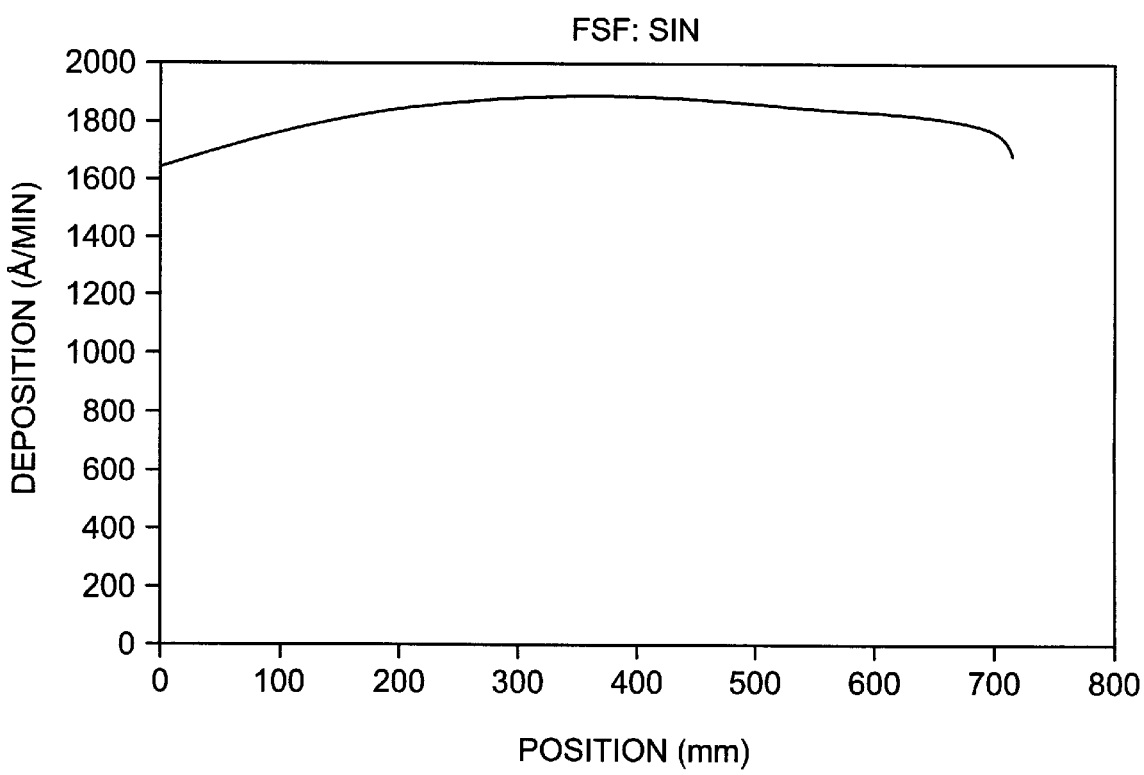
FIG. 10 is a graphical representation of the planarity of a flat glass panel substrate having a layer of silicon nitride deposited thereon using the present invention.

The present invention achieves substantially improved results over the prior art. A comparison between a conventional clamping apparatus and the present invention is provided with reference to Table I below and FIGS. 1, 2, 9 and 10. A single substrate, horizontally-aligned CVD chamber for manufacturing thin film transistors, similar to chamber 10 of FIG. 3, was used to deposit various silicon-containing layers on flat glass panels. FIGS. 9 and 10 graphically represent the deposition planarity on glass substrates using the present invention. FIGS. 9 and 10 indicate uniform deposition over the entire area of the substrate. In contrast, FIGS. 1 and 2 represent the deposition profiles of substrates using a conventional clamping assembly. FIGS. 1 and 2 reveal non-uniform deposition at the edges of the substrate, i.e., between 0 mm and 30 mm and between 690 mm and 720 mm. The non-uniform deposition resulted in unusable area. Table I provides the processing parameters for FIGS. 1, 2, 9 and 10.

TABLE 1

| Flat Glass Panel with Deposition | Inlet Gas Mixture | Plasma RF Power Level (Watt) | Chamber Pressure (Torr) | Chamber Temperature (° C.) | Spacing (mil)* |
|---|---|---|---|---|---|
| a-Si (FIG. 1)[1] | 300 sccm SiH$_4$ | 200 | 0.4 | 365 | 750 |
| a-Si (FIG. 9)[2] | 300 sccm SiH$_4$ | 200 | 0.4 | 365 | 750 |
| SiN (FIG. 2)[1] | 480 sccm SiH$_4$ 3000 sccm NH$_3$ 4800 sccm N$_2$ | 2900 | 2.0 | 365 | 1150 |
| SiN (FIG. 10)[2] | 480 sccm SiH$_4$ 3000 sccm NH$_3$ 4800 sccm N$_2$ | 2900 | 2.0 | 365 | 1150 |

*Spacing is between plasma shower head openings and substrate
[1]Conventional shadow frame was used
[2]Tab shadow frame of the present invention was used While the foregoing is directed to the preferred embodiment of the present invention, other and further embodiments of the invention may be devised without departing from the basic scope thereof, and the scope thereof is determined by the claims that follow.

What is claimed is:

1. An apparatus for supporting a substrate, comprising:
   (a) a substrate support member;
   (b) a floating plasma shield positionable on the substrate support member, wherein the floating plasma shield extends inwardly under a substrate receiving position on the support member; and
   (c) a horizontally alignable shadow frame comprising a plurality of tabs for stabilizing a substrate disposed on the substrate support member.

2. The apparatus of claim 1, wherein the tabs comprise a protruding substrate contact surface at a terminal end.

3. The apparatus of claim 1, wherein the tabs comprise rounded surfaces.

4. The apparatus of claim 1, wherein the tabs comprise a protruding substrate contact surface at a terminal end and a roof portion forming a recess adjacent the protruding substrate contact surface adapted to maintain a spaced relation with the substrate.

5. The apparatus of claim 1, wherein each tab is adapted to supply a pressure between about 0.05 and about 0.2 lbs/mm$^2$ to a substrate during processing.

6. The apparatus of claim 1, wherein the shadow frame comprises a material selected from a group consisting of ceramic, aluminum, anodized aluminum and a combination thereof.

7. The apparatus of claim 1, wherein the floating plasma shield comprises a material selected from a group consisting of ceramic, aluminum, and a combination thereof.

8. An apparatus, comprising:
   (a) a support member having an upper support surface;
   (b) a floating plasma shield disposed at a perimeter of the support member, wherein the floating plasma shield is disposed to seal a gap defined by the shadow frame and a substrate disposed on the upper support surface; and
   (c) a shadow frame having a plurality of tabs positionable on the substrate disposed on the upper support surface.

9. The apparatus of claim 8, wherein the shadow frame comprises a material selected from the group consisting of ceramic, aluminum, anodized aluminum and a combination thereof.

10. The apparatus of claim 8, wherein the tabs comprise a substrate contact surface.

11. The apparatus of claim 8, wherein the floating plasma shield comprises a material selected from the group consisting of ceramic, aluminum, and a combination thereof.

12. The apparatus of claim 8, wherein an expansion gap is defined between the floating plasma shield and the support member to accommodate the thermal expansion of the floating plasma shield in a processing position.

13. The apparatus of claim 8, further comprising:
   (d) a plurality of insulating members disposed at the perimeter of the support member, wherein the floating plasma shield is disposed on the plurality of insulating members.

14. The apparatus of claim 13, wherein the plurality of insulating members is disposed on a recessed shoulder formed at the perimeter of the support member.

15. The apparatus of claim 13, wherein the plurality of insulating members comprises a dielectric material.

16. The apparatus of claim 13, wherein the plurality of insulating members comprises ceramic.

17. The apparatus of claim 13, wherein the plurality of insulating members comprises alignment pins having a tapered surface at an upper end thereof and wherein the shadow frame comprises an alignment recess having corresponding, conforming surfaces for mating with the tapered surface to urge the shadow frame into a desired position.

18. The apparatus of claim 17, wherein the upper ends of the alignment pins are disposed through holes formed in the floating plasma shield.

19. A processing chamber, comprising:
  (a) an enclosure defining a processing region;
  (b) a gas distribution assembly defining an upper boundary of the processing region;
  (c) a shadow frame disposed in the enclosure and positionable in the processing region, wherein the shadow frame comprises a plurality of tabs extending inwardly;
  (d) a support member movably disposed in the enclosure; and
  (e) a floating plasma shield disposed over a perimeter portion of the support member, wherein the floating plasma shield is disposed to seal a gap defined by the shadow frame and a substrate positioned on an upper surface of the support member.

20. The apparatus of claim 19, wherein the shadow frame comprises a material selected from ceramic, aluminum, anodized aluminum and a combination thereof.

21. The processing chamber of claim 19, wherein the tabs comprise a substrate contact surface.

22. The processing chamber of claim 19, wherein the floating plasma shield comprises a material selected from ceramic, aluminum, or a combination thereof.

23. The processing chamber of claim 19, further comprising:
  (f) a plurality of insulating members disposed at a perimeter of the support member, wherein the floating plasma shield is disposed on the plurality of insulating members.

24. The processing chamber of claim 23, wherein the plurality of insulating members comprises a dielectric material.

25. The processing chamber of claim 23, wherein the plurality of insulating members comprises ceramic.

26. The processing chamber of claim 23, wherein the plurality of insulating members comprises alignment pins having a tapered surface at an upper end thereof and wherein the shadow frame comprises an alignment recess having corresponding, conforming surfaces for mating with the tapered surface to urge the shadow frame into a desired position.

27. The processing chamber of claim 23, wherein the upper ends of the alignment pins are disposed through holes formed in the floating plasma shield.

* * * * *

UNITED STATES PATENT AND TRADEMARK OFFICE
CERTIFICATE OF CORRECTION

PATENT NO.   : 6,355,108 B1
DATED        : March 12, 2002
INVENTOR(S)  : Won et al.

It is certified that error appears in the above-identified patent and that said Letters Patent is hereby corrected as shown below:

<u>Column 8,</u>
Lines 51 and 65, please change "gap a" to -- gap α --.

Signed and Sealed this

Twenty-ninth Day of July, 2003

JAMES E. ROGAN
*Director of the United States Patent and Trademark Office*